Figure 1:
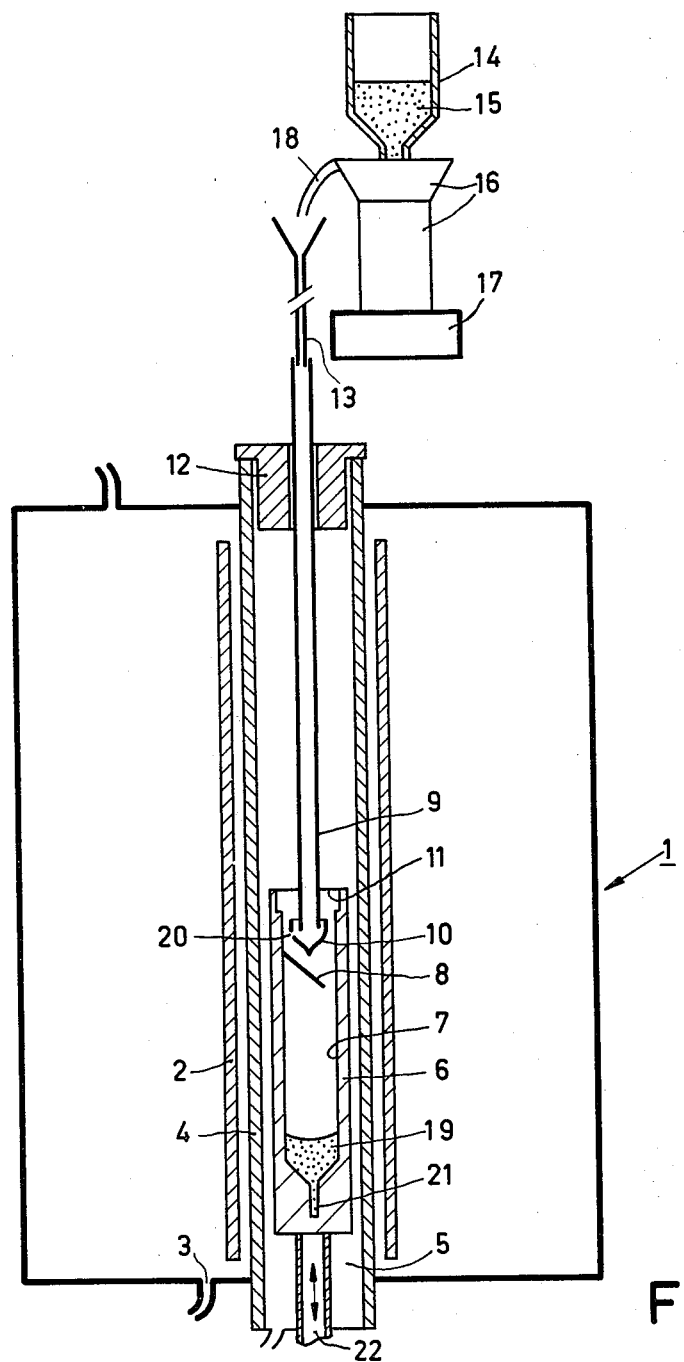

United States Patent [19]

Damen et al.

[11] 4,379,021
[45] Apr. 5, 1983

[54] METHOD OF MANUFACTURING SINGLE CRYSTALS

[75] Inventors: Johannes P. M. Damen; Theodorus J. Berben, both of Eindhoven, Netherlands

[73] Assignee: U.S. Philips Corporation, New York, N.Y.

[21] Appl. No.: 302,267

[22] Filed: Sep. 15, 1981

[30] Foreign Application Priority Data

Sep. 24, 1980 [NL] Netherlands .......................... 8005312

[51] Int. Cl.³ ............................................. C30B 11/08
[52] U.S. Cl. ........................ 156/616 R; 156/DIG. 74
[58] Field of Search ...... 156/616 R, 616 A, DIG. 74, 156/620; 422/253

[56] References Cited

U.S. PATENT DOCUMENTS

| | | | |
|---|---|---|---|
| 2,361,382 | 10/1944 | Camin | 156/616 R |
| 2,905,989 | 9/1959 | Black | 156/616 R |
| 3,060,065 | 10/1962 | Orem | 156/616 R |
| 3,434,892 | 3/1969 | Heimke | 156/616 R |
| 4,312,700 | 1/1982 | Helmreich et al. | 156/616 R |

FOREIGN PATENT DOCUMENTS 50-131900 10/1975 Japan .

OTHER PUBLICATIONS

Sugimoto, "Magnetic Single Crystals", published in book *Crystals*, Springer-VerLag Press, N.Y., Jan. 1978, pp. 125-139.

*Primary Examiner*—Hiram H. Bernstein
*Attorney, Agent, or Firm*—Paul R. Miller

[57] ABSTRACT

A method of manufacturing a single crystal of a composite oxide by gradual solidification of a melt with solidification starting from a seed crystal which initially is in contact with the melt, is provided wherein to obtain a single crystal having a composition which is as homogeneous as possible (homogeneous within 1 mol. %) the following measures are taken: first, initially the melt consists of no more than 25% by weight of the single crystal to be grown; and second, during the solidification process molten material is added to the melt at the same rate and having the same composition as material solidifies out from the melt.

10 Claims, 2 Drawing Figures

METHOD OF MANUFACTURING SINGLE CRYSTALS

The invention relates to a method of manufacturing a single crystal of a composite oxide by gradually solidifying a melt.

Japanese Patent Application Kokai No. 50.131900 describes a modified Bridgman method of manufacturing a single crystal of a composite oxide by gradually solidifying a melt with solidification starting from a single crystal which initially is in contact with the melt, in which method components having concentrations decreasing in the melt, are added to the melt during the solidification process.

In the original Bridgman method, a single crystal is grown by causing a given quantity of melt in a vertically disposed cylindrical crucible to solidify slowly from the bottom upwards. When the melt, used for the growth of a composite oxide, consists of a multicomponent system, the solidification temperature will depend on the composition. In that case the composition of the solid will differ from that of the melt from which it crystallizes. This is the case, for example, with MnZn ferrite. For example, a melt of 50 mol.% $ZnFe_2O_4$ and 50 mol.% $MnFe_2O_4$ is in equilibrium with a crystal which consists of 57 mol.% $ZnFe_2O_4$ and 43 mol.% $MnFe_2O_4$. The zinc content of later-crystallizing material decreases because too much zinc is continuously withdrawn from the melt. As a result of this there is a composition gradient in the growth direction of the crystal. This causes stresses which may produce dislocations and cracks. In a crystal having such a composition gradient, the wafers cut from this single crystal have different magnetic properties. This means that usually only the wafers which are cut from the center of the single crystal are useful, which considerably increases the price of usable material. Since MnZn ferrite wafers are a very important basic material from which write/read heads used, for example, in video recorders are manufactured in large numbers, both the tendency for the wafers to crack and the spread in magnetic properties are extremely undesirable.

In order to be able to grow single crystals with a more uniform composition, a modification of the Bridgman method has been developed. This modification which is described in the above-mentioned publication has for its object to keep the melt composition substantially constant during growth by adding per unit time the same amounts of ZnO and $Fe_2O_3$ as the excess quantities with respect to the liquiders composition which are removed from the liquid to the solid per unit time. For this purpose, 8 g of granulate consisting of sintered particles composed of 87 mol.% $Fe_2O_3$ and 13 mol.% ZnO are gradually added to a melt of 600 g of $(MnZn)_1Fe_2O_4$. Although this modified methods leads to a better result (the composition over the first 75% by weight of the grown crystal does not vary by more than 4 mol.% instead of previously by 10 mol.%), it is still capable of being improved.

It is the object of the invention to provide a modified Bridgman method which leads to the growth of single crystals of composite oxides having lower variations of the composition.

For that purpose, the method according to the invention is characterized in that crystal growth starts from a quantity of melt having a composition which is at most 25% by weight of the composition of the single crystal to be grown, and that during the solidification process molten material having the same composition as the material solidifying from the melt is added to the melt in such quantities that the overall quantity of the melt remains constant throughout substantially the whole process.

It has been found that single crystals of composite oxides, for example MnZn ferrite single crystals, can be grown by means of a method according to the invention having a composition which does not vary by more than 1 mol.% over three quarters of the length of the grown crystal. This is a substantial improvement over the result of the prior art process. This improvement is based on the fact that the quantity of melt at the start of crystal growth is small with respect to the mass of the crystal to be grown (less than 25%, preferably 5 to 10%). As soon as a quantity of this melt has solidified, the same quantity with the same composition is added, the overall quantity of melt, which is small with respect to the mass of the crystal to be grown, remains constant throughout substantially the whole process. This considerably promotes the homogeneity of the melt.

In the known method, on the contrary, a quantity of material which is substantially equal to the mass of the crystal to be grown is molten at the beginning of the crystal growth process. The quantity of melt used in this known method decreases progressively during growth, and the melt composition is kept substantially constant by replenishing at the required rate those constituents of the melt which become depleted (a total of some percents of the overall weight of the growth crystal). This known method depends considerably on vertical transport of material through the melt in order to maintain the homogeneity of the melt. In fact, the larger the melt, the less effective is the transport of material through the mass and the smaller the possibility that the melt is really homogeneous.

The addition of material to the melt during the growth should disturb the melt as little as possible. For that purpose, one embodiment of a method according to the invention is characterized in that the material to be added has the starting form of granules which are melted before they reach the melt and in a particular case reach the surface of the melt in dropform. In this manner the disturbance is small and is as far remote as possible from the growing crystal.

A dropwise addition can be realised in a practical manner by supplying the material gradually to an open reservoir provided above the surface of the melt, which reservoir is kept at a temperature which is at least equal to the melting temperature of the material, the quantity of material which is supplied to the reservoir per unit of time being equal to the quantity of molten material leaving the reservoir. The material melted in the reservoir can be guided from the reservoir to the melt in various manners. For example, the reservoir may have a bottom with small openings or may have an overflow. The molten drops may drop directly into the melt or may be guided by a wire or gutter to the wall of the crucible in which the crystal growth takes place and may then run down the wall to the surface of the melt.

When the material is poured into the reservoir in the form of (too) large lumps, the lumps may damage the bottom of the reservoir. During their fall, they may also cause spatters, and the spattered drops may produce clogging by solidification in colder parts of the supply plant. In additition, each large lump of material causes a sudden drop in temperature because heating and melting thereof consumes much heat.

The supply of the material in powder form instead of as lumps, however, may also present problems in that (a) powder easily sticks to the walls of the supply plant, and (b) powder remains suspended in the supply pipe as a result of a chimney effect. Both (a) and (b) may lead to clogging. According to a further embodiment of the method in accordance with the invention, the material is supplied in the form of granules. In particular when these have a diameter of not smaller than 0.2 mm and not larger than 4 mm, it has been found that the above-mentioned problems do not occur. When the granules are smaller than approximately 0.2 mm, the character is too much powder-like so that the "self-cleaning" effect of the granules (granules adhering to the wall of the supply plant, if any, are displaced by subsequent granules) is reduced. Granules larger than approximately 4 mm are not only difficult to dose accurately, but they are also expensive to make and may give rise to the above-mentioned temperature drop effect. Where the diameter of the pipe used in the supply plant is preferably 3 to 5 times the granulate diameter, such big granules would also require a pipe having an unpractically large diameter. The growth procedure according to the invention is started with a restricted quantity of melt. However, the quantity may not be too small, preferably not less than 5% of the mass of the crystal to be grown. In the case of too small a quantity of melt:

(i) the disturbance is too large when fresh material is added since thermal and rehological disturbances and variations in compositions in the melt influence the crystallisation process, and (ii) a variation in the crystallisation rate has too large an influence on the quantity and the composition of the melt.

According as the quantity of melt is chosen to be larger, the procedure more and more resembles the original Bridgman method. Satisfactory results are obtained with a melt which amounts to 10% of the mass of the ultimately grown crystal.

The restricted filling of the crucible at the beginning of the process has an extra advantage. During melting ferrite, gas is released. In a normal Bridgman process, the crucible is filled entirely. When the charge is melted too rapidly, the effervescing mass flows over the rim of the crucible. In the method according to the invention, so little initial charge is present in the crucible that the mass does not reach the rim of the crucible, even when there is strong effervescence.

Figure 2:
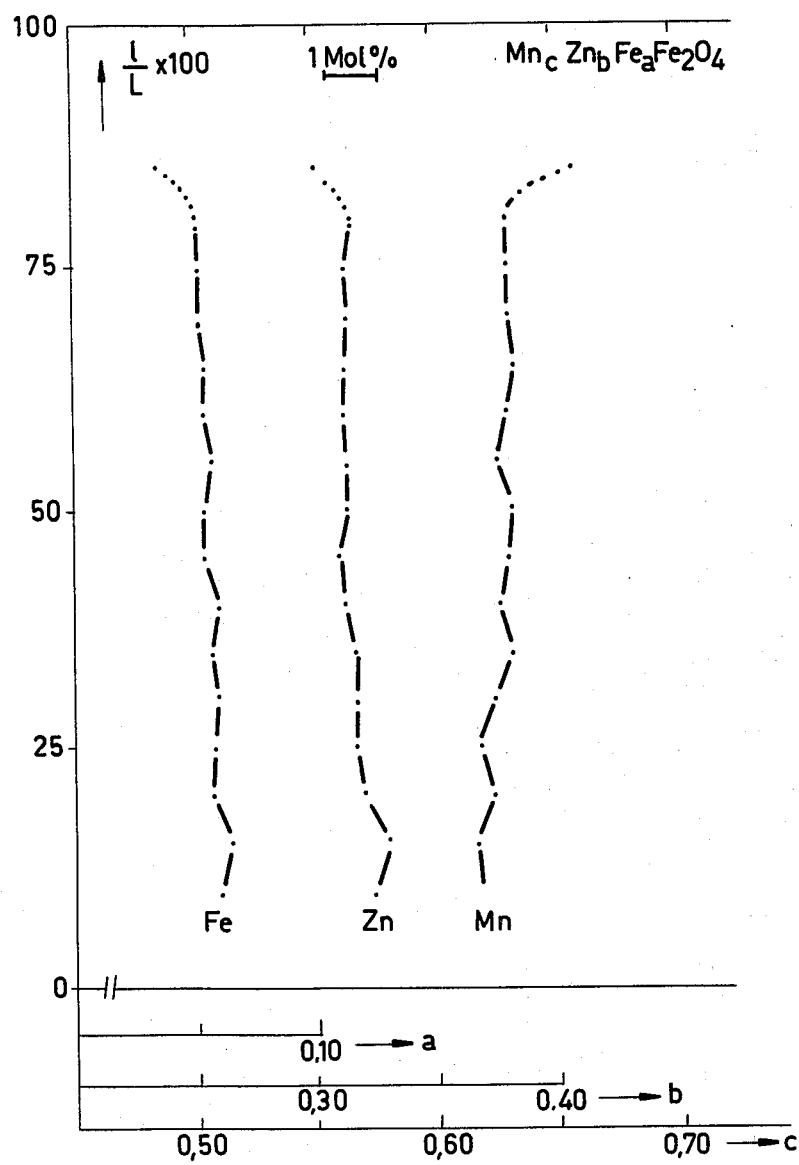

An embodiment of the invention will now be described with reference to the drawings, in which:

FIG. 1 shows diagrammatically an apparatus suitable for use in the present invention and FIG. 2 is a graph showing the variation of the composition (mol.%) at different longitudinal positions on an MnZn ferrite single crystal grown by means of the method according to the invention.

The method according to the invention can be performed efficaciously using the apparatus shown in FIG. 1. The apparatus comprises the following components:
a pot furnace 1 with insulation,
a heating element 2 (graphite or resistance wire),
an inlet 3 for protective gas, if any, to be used to protect the heating element 2,
an $Al_2O_3$ tube 4,
a crystal growth space 5 (filled with an oxidizing gas),
a crucible holder 6 which supports a platinum crucible
7 terminating in a seed tube 21,
a dripping plate 8,
a supply tube 9,
a reservoir 10,
a sealing plate 11,
a sealing bush ($Al_2O_3$) 12,
a filling tube 13 with an integral funnel,
a storage hopper 14 containing a granulate 15,
a vibratory feeder 16,
a weighing device 17,
a vibratory gutter 18,
a starting mixture 19 (powder),
an overflow aperture 20,
a seed tube 21 with a seed crystal, and a tubular alumina support 22.

The method according to the invention will be described with reference to the growth of a (MnZn) ferrite single crystal. However, it is also suitable for growing single crystals of other oxide compositions, in particular magnetic composite oxides, such as orthoferrites and rare earth iron garnets.

A seed crystal cut from a previously manufactured single crystal in which the longitudinal direction has a crystallographic direction desired for a particular application is placed in the seed tube 21, and 450 g of powder having a composition A:$Mn_{0.68}Zn_{0.28}Fe_{2.04}O_4$ is placed in the platinum crucible 7 which is then placed the furnace in the crucible holder 6 in the furnace 1. The chosen quantity of 450 g is associated with the requirement that at the beginning of crystal growth a column of liquid of a sufficient height must be above the seed crystal. In practice a height between 10 and 50 mm proves to be satisfactory as does 20 and 50 mm. The hopper 14 is filled with 6000 g of granulate 15 (composition B: $Mn_{0.62}Zn_{0.32}Fe_{2.06}O_4$). During crystal growth so much of composition B is added as is necessary to keep the height of the colum of liquid constant. The granulate 15 consists of particles having diameters from 0.4 to 1.2 mm. The particles are prepared by mixing in a cup a powder with 10% by weight of water and 5% of binder, pressing it through a sieve and then rolling it in a drum. The desired fraction is sieved out, pre-sintered in air at a temperature of between approximately 1000° and 1200° C. and again sieved.

Crystal growth furnace 1 (FIG. 1) is heated until the upper part, at least from the center of the seed crystal in seed tube 21 up to and including reservoir 10, has a temperature above the melting temperature of MnZn ferrite and the lower part has a temperature below the melting temperature. (When the crucible 7 is in the uppermost position, the center of the seed crystal is located approximately at the center of the furnace.) These temperatures are, for example, 30° C. above and 40° C. below, respectively, the melting point of MnZn ferrite. The temperature gradient occurring in the transition zone must be so small that cracking of the crystal is prevented. An oxidizing gas atmosphere (in the case of MnZn ferrite this is an oxygen atmosphere) is maintained in the crystal growth space 5, while the heating element 2, if it consists of a metal may be, for example, in an atmosphere of hydrogen gas. The pressure of the oxygen gas atmosphere is 1 atmosphere and the flow rate of the oxygen is preferably chosen to be so slow that a minimum or no exchange takes place with the gas atmosphere built up in the crucible above the melt. This measure considerably delays evaporation of easily evaporting components from the melt and hence contributes to the composition of the melt remaining constant. Without this measure ZnO easily evaporates from the melt when growing an MnZn ferrite single crystal.

The supply tube 9 extends through and is clamped by the sealing plate 11 which is fitted to the top of the crucible 7. The crucible holder 6 is connected to an alumina support 22 extending below the lower end of the furnace 1 where it is connected to a mechanism (not shown) which can move the support 22 in a vertical direction. The crucible 6 is moved upwards at a rate of approximately 1 cm/hour until the center of the seed tube 21 has reached a position in which all the ferrite starting mixture 19 is molten and half the seed crystal has melted. This position is determined empirically during preceding runs. The crucible 7 is then lowered at a rate of a few mm/hour. The remaining part of the seed now begins to grow.

When the crucible 7 has been lowered until the single crystal has grown up to approximately half the height of the conical part of the crucible 7, the supply of granulate 15 from the storage hopper 14 begins. When the crystal grows above this level, the quantity of solidifying material will no longer be negligible with respect to the initial quantity of the melt, and the composition of the melt will start varying. The decrease in weight of the liquid is first compensated during the crystal growth in the upper half of the cone of the crucible 6. Once the material grows in the cylindrical part of the crucible 7 where the crystallisation rate is linear, the rate of supply of the granulate 15 accurately controlled so that the rate at which granulate is supplied is equal to the rate at which material is solidifying so that the quantity of the melt and the composition thereof remain constant, which yields a crystal having a uniform composition along the direction of growth. After the last of the 6000 g of the granulate 15 have been dispensed from the storage hopper 14, the crucible 7 is lowered for another approximately 10 hours at the growth rate so as to allow the remaining 450 g of liquid to solidify. The furnace 1 is then cooled very gradually. After cooling, the platinum crucible 7 is removed from the furnace 1 and peeled from the crystal so as to obtain the crystal.

The supply of the granulate 15 during the growth occurs as follows.

The granulate 15 is fed into the filling tube 13 by a vibratory gutter 18 which is connected to a vibratory feeder 16. The vibratory feeder 16 is accommodated on the weighing device 17.

By adjusting the amplitude of the vibratory feeder 16 by controlling the supply voltage of the vibrating mechanism, a certain feed rate can be produced. It is possible with this system to supply the granulate 15 to the reservoir 10 at a steady rate so that no temperature steps of any significance can occur within the crucible 6.

The granulate 15 supplied from the feeder 16 falls into the reservoir 10 and melts there. Molten ferrite composition B is supplied from the reservoir 10 through the overflow aperture 20 and then falls onto the dripping plate 8. The plate 8 is so disposed in the crucible 6 that drops then run down the wall of the crucible. The dripping plate 8 has an important function within the scope of the invention, because this plate also restricts the zinc evaporation, prevents granules from landing in the melt, and functions better than a guide wire so as to prevent drops from falling directly into the melt from too great a height.

FIG. 2 indicates the quality of an MnZn ferrite single crystal grown by means of the method according to the invention. On the vertical axis is plotted the quantity 100 l/L, where l is the distance from a location in the crystal to the end from which growth began and L is the overall length of the crystal, the composition being plotted on the horizontal axis. From this it appears that the composition is constant within 1 mol.% over well over three quarters of the length.

The part of the crystal having the substantially constant composition is sawed into discs which are subsequently further processed. In order to be able to shape these discs into heads for video recorders, the discs are each divided into a number of rectangular wafers.

What is claimed is:

1. A method of manufacturing a single crystal of a composite oxide by gradually solidifying a melt comprising the steps of
   arranging a seed crystal in contact with a volume of a melt, said seed crystal initially having the top of the seed crystal between 20 and 50 mm below the top surface of said melt,
   solidifying said melt starting from said seed crystal, said melt initially consisting of not more than 25% by weight of the single crystal to be grown, and
   adding to said melt, after said single crystal begins to grow, molten material having the same composition as material solidifying from said melt, said molten material being added in such quantities that the overall quantity of said melt remains constant throughout substantially the entire process.

2. A method according to claim 1, wherein said molten material added to said melt has a starting shape of granules which are melted before reaching said melt.

3. A method according to one of claims 1 or 2, wherein said molten material is added to said melt from a reservoir provided above the surface of said melt, said molten material being formed of material gradually supplied to said reservoir in a quantity per unit time in equilibrium with the quantity of molten material leaving said reservoir, and wherein said reservoir is kept at a temperature at least equal to the melting temperature of said molten material.

4. A method according to claim 3, wherein said material is supplied to said reservoir in the form of granules having a diameter of from 0.2 mm to 4 mm.

5. A method according to claim 3, wherein said molten material leaving said reservoir is guided toward an inside wall of a vessel containing said melt.

6. A method according to claim 3, wherein during solidification of said melt, the area above said melt is maintained in minimum gas exchange with its ambience.

7. A method according to claim 3, wherein said single crystal consists of a manganese zinc ferrite.

8. A method according to claim 1, wherein during solidification of said melt, the area above said melt is maintained in minimum gas exchange with its ambience.

9. A method according to claim 1, wherein said single crystal consists of a manganese zinc ferrite.

10. A method according to claim 1, wherein said molten material is added to said melt when the quantity of solidifying material is no longer negligible with respect to the initial quantity of said melt.

* * * * *